(12) United States Patent
Kwon et al.

(10) Patent No.: US 9,997,734 B2
(45) Date of Patent: Jun. 12, 2018

(54) ORGANIC LIGHT EMITTING DISPLAY DEVICE

(71) Applicant: LG Display Co., Ltd., Seoul (KR)

(72) Inventors: Sunkap Kwon, Paju-si (KR); Kyuil Han, Paju-si (KR)

(73) Assignee: LG Display Co., LTD, Seoul (KR)

( * ) Notice: Subject to any disclaimer, the term of this patent is extended or adjusted under 35 U.S.C. 154(b) by 0 days. days.

(21) Appl. No.: 15/592,844

(22) Filed: May 11, 2017

(65) Prior Publication Data

US 2017/0338438 A1    Nov. 23, 2017

(30) Foreign Application Priority Data

May 23, 2016  (KR) .......................... 10-2016-0062967

(51) Int. Cl.
| | |
|---|---|
| H01L 35/24 | (2006.01) |
| H01L 51/00 | (2006.01) |
| H01L 51/52 | (2006.01) |
| H01L 27/32 | (2006.01) |
| H01L 51/50 | (2006.01) |

(52) U.S. Cl.
CPC ...... *H01L 51/5212* (2013.01); *H01L 27/3211* (2013.01); *H01L 27/3246* (2013.01); *H01L 27/3248* (2013.01); *H01L 27/3258* (2013.01); *H01L 27/3262* (2013.01); *H01L 51/0097* (2013.01); *H01L 51/5016* (2013.01); *H01L 51/5056* (2013.01); *H01L 51/5088* (2013.01); *H01L 51/5221* (2013.01); *H01L 2251/301* (2013.01); *H01L 2251/308* (2013.01); *H01L 2251/5338* (2013.01)

(58) Field of Classification Search
CPC ............. H01L 51/5212; H01L 51/5016; H01L 27/3262; H01L 51/0097; H01L 51/5056; H01L 51/5088; H01L 51/5221; H01L 27/3211; H01L 27/3246; H01L 27/3258; H01L 27/3248; H01L 2251/308; H01L 2251/301; H01L 2251/5338
USPC ......................................... 257/79, 40, 59, 72
See application file for complete search history.

(56) References Cited

U.S. PATENT DOCUMENTS

2014/0367651 A1* 12/2014 Song ................... H01L 51/5228
257/40

* cited by examiner

*Primary Examiner* — Thien F Tran
(74) *Attorney, Agent, or Firm* — Fenwick & West LLP (57) ABSTRACT

Embodiments disclosed herein relate to a light emitting display device comprising a plurality of subpixels, the plurality of subpixels including at least a first subpixel and a second subpixel. The light emitting display device includes a common layer shared by a first light emitting diode of the first subpixel and a second light emitting diode of the second subpixel, the common layer disposed between a first anode electrode and a first cathode electrode of the first subpixel and between a second anode electrode and a second cathode electrode of the second subpixel, and an auxiliary electrode disposed on a different layer from the common layer, the first anode electrode, the first cathode electrode, the second anode electrode, and the second cathode electrode, the auxiliary electrode connected to the common layer through a contact hole.

17 Claims, 7 Drawing Sheets

ORGANIC LIGHT EMITTING DISPLAY DEVICE

CROSS-REFERENCE TO RELATED APPLICATIONS

This application claims the priority of Republic of Korea Patent Application No. 10-2016-0062967 filed on May 23, 2016, with the Korean Intellectual Property Office, the disclosure of which is incorporated herein by reference.

BACKGROUND

Field

The present disclosure relates to an organic light emitting display device, and more particularly, to an organic light emitting display device which may prevent an unintended sub pixel from emitting light to improve reliability.

Description of the Related Art

An organic light emitting display device (OLED) is a self-light emitting display device. The organic light emitting display device is a display device using an organic light emitting element which injects holes from an anode and electrons from a cathode into a light emitting layer and emits light when an exciton generated by recombination of the injected holes and electrons changes its state from an excited state to a ground state.

The organic light emitting display device is classified into a top emission type, a bottom emission type, and a dual emission type depending on a direction of emitted light and is classified into a passive matrix type and an active matrix type depending on a driving method.

The organic light emitting display device does not need a separate light source unlike a liquid crystal display device (LCD) and thus, may be manufactured into a lightweight and thin form. Further, the organic light emitting diode display device is advantageous in terms of power consumption since it is driven with a low voltage. Also, the organic light emitting diode display device has excellent color expression ability, a high response speed, a wide viewing angle, and a high contrast ratio (CR). Therefore, the organic light emitting diode display device has been researched as a next-generation display device.

SUMMARY

Embodiments disclosed herein relate to an electroluminescent display device comprising a thin film transistor on a surface of a substrate facing in a first direction, a protective layer on the thin film transistor, a planarizing layer covering a surface of the protective layer facing in the first direction, a first electrode disposed on a surface of the planarizing layer facing in the first direction and connected to the thin film transistor, a bank on one side of the first electrode, a light emitting unit disposed on a surface of the first electrode, the light emitting unit including a transporting layer and a light emitting layer, a second electrode on a surface of the light emitting unit facing in the first direction, and an auxiliary electrode disposed below the first electrode and the bank, a first area of the auxiliary electrode facing a portion of the bank in the first direction, the auxiliary electrode directly connected to the transporting layer.

In one or more embodiments, the auxiliary electrode is disposed between the protective layer and the planarizing layer. The transporting layer and the auxiliary electrode may be connected to each other through a contact hole penetrating the planarizing layer and the bank.

In one or more embodiments, the transporting layer includes at least one of a hole injecting layer and a hole transporting layer.

In one or more embodiments, the auxiliary electrode is electrically connected to the first electrode.

In one or more embodiments, a second area of the auxiliary electrode faces a portion of the first electrode in the first direction.

In one or more embodiments, the electroluminescent display device further includes a red light emitting layer of a red sub pixel, a green light emitting layer of a green sub pixel, and a blue light emitting layer of a blue sub pixel. The red light emitting layer, the green light emitting layer, and the blue light emitting layer may include at least one phosphorescent material.

In one or more embodiments, the auxiliary electrode is formed of at least one of aluminum (Al), silver (Ag), calcium (Ca), magnesium (Mg), platinum (Pt), gold (Au), copper (Cu), and indium tin oxide (ITO).

Embodiments disclosed herein relate to an organic light emitting display device including an organic layer corresponding to a red sub pixel, a green sub pixel, and a blue sub pixel, and organic light emitting layers, each corresponding to a respective one of the red sub pixel, the green sub pixel, and the blue sub pixel. The organic layer and the organic light emitting layers may be disposed between a first electrode and a second electrode. The organic layer may be in contact with an auxiliary electrode below the first electrode through a contact hole penetrating a bank which defines at least one of the red sub pixel, the green sub pixel, and the blue sub pixel.

In one or more embodiments, the organic light emitting display device further includes a thin film transistor, a protective layer, and a planarizing layer configured below the first electrode. The auxiliary electrode may be disposed between the protective layer and the first electrode.

In one or more embodiments, the organic layer includes at least one of a hole injecting layer and a hole transporting layer.

In one or more embodiments, the thin film transistor includes a gate electrode, a source electrode, and a drain electrode. The auxiliary electrode may form a storage capacitance together with the source electrode or the drain electrode.

In one or more embodiments, a first area of the auxiliary electrode overlaps with a portion of the first electrode and a second area of the auxiliary electrode overlaps with a portion of the bank.

Embodiments disclosed herein relate to a light emitting display device comprising a plurality of subpixels, the plurality of subpixels including at least a first subpixel and a second subpixel. The light emitting display device includes a common layer shared by a first light emitting diode of the first subpixel and a second light emitting diode of the second subpixel, the common layer disposed between a first anode electrode and a first cathode electrode of the first subpixel and between a second anode electrode and a second cathode electrode of the second subpixel, and an auxiliary electrode disposed on a different layer from the common layer, the first anode electrode, the first cathode electrode, the second anode electrode, and the second cathode electrode, the auxiliary electrode connected to the common layer through a contact hole.

In one or more embodiments, a first area of the auxiliary electrode overlaps with a portion of the first light emitting diode and a second area of the auxiliary electrode overlaps with a portion of the second light emitting diode. The first area of the auxiliary electrode may overlap with a portion of the first anode electrode and the second area of the auxiliary electrode may overlap with a portion of the second anode electrode.

In one or more embodiments, the contact hole penetrates a bank separating the first light emitting diode and the second light emitting diode.

In one or more embodiments, the light emitting display device further includes a thin film transistor to control an operation of one of the first light emitting diode and the second light emitting diode, and a protective layer covering the thin film transistor, the protective layer formed between the thin film transistor and the one of the first light emitting diode and the second light emitting diode. The auxiliary electrode may be disposed between the protective layer and the one of the first light emitting diode and the second light emitting diode.

In one or more embodiments, the common layer includes at least one of a hole injecting layer and a hole transporting layer.

In one or more embodiments, the common layer includes an organic material.

Objects of the present disclosure are not limited to the above-mentioned objects, and other objects, which are not mentioned above, can be clearly understood by those skilled in the art from the following descriptions.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF DRAWINGS

The above and other aspects, features and other advantages of the present disclosure will be more clearly understood from the following detailed description in conjunction with the accompanying drawings, in which.

DETAILED DESCRIPTION OF THE PREFERRED EMBODIMENTS

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but may be implemented in various forms. The exemplary embodiments are provided by way of example only so that a person of ordinary skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," and "having," used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely coupled to or combined with each other and can be interlocked and operated in technically various ways, and the embodiments can be carried out independently of or in association with each other.

Hereinafter, the present disclosure will be described in detail with reference to the accompanying drawings.

Figure 1:
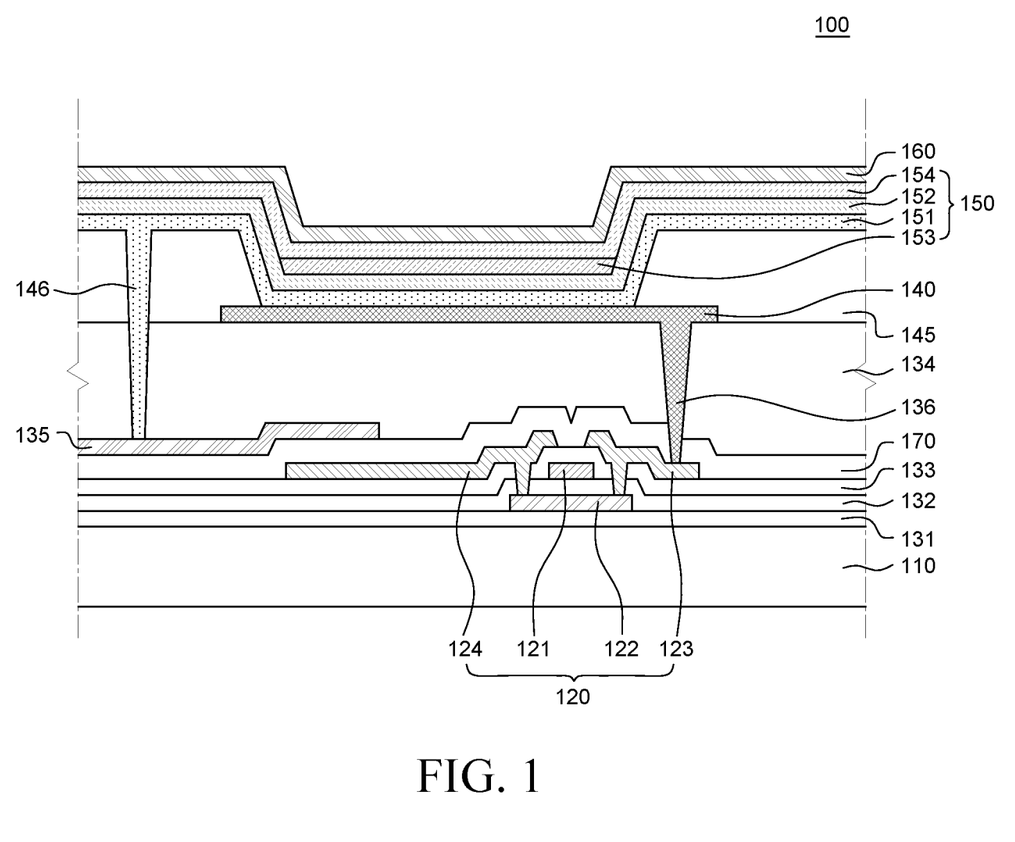
FIG. 1 is a view illustrating a cross-sectional structure of an organic light emitting display device according to an exemplary embodiment of the present disclosure.

FIG. 1 is a view illustrating a cross-sectional structure of an electroluminescent display device (or a light emitting display device such as an organic light emitting display device) according to an exemplary embodiment of the present disclosure.

Referring to FIG. 1, an organic light emitting display device 100 according to an exemplary embodiment of the present disclosure includes a substrate 110, a thin film transistor 120 disposed on the substrate 110, and a light emitting unit 150 which is disposed between a first electrode 140 and a second electrode 160 and includes transporting layers (e.g., one or more of a hole injecting layer, a hole transporting layer, an electron injecting layer, and an electron transporting layer or any organic layer) and light emitting layer (e.g., an organic emitting layer). In some embodiments, other inorganic layers and inorganic light emitting layers may be used instead of the plurality of organic layers and the organic emitting layer.

The organic light emitting display device 100 includes a plurality of sub pixels. A sub pixel refers to a unit of an area where light is actually emitted. Further, a plurality of sub pixels form a group (or a pixel) for outputting white light. For example, three sub pixels of a red sub pixel, a green sub pixel, and a blue sub pixel form one group of subpixels or one pixel. However, the present disclosure is not limited thereto and various sub pixel designs may be allowed. In FIG. 1, for convenience of description, only one sub pixel among the plurality of sub pixels of the organic light emitting display device 100 is illustrated.

In the organic light emitting display device 100, the substrate 110 is provided to support various components of the organic light emitting display device 100 and is formed of an insulating material. For example, the substrate 110 may be formed of not only glass, but also a plastic substrate such as polyethylene terephthalate (PET), polyethylene naphthalate (PEN), or polyimide. When the organic light emitting display device is a flexible organic light emitting display device, the organic light emitting display device may be formed of a flexible material such as plastic. Further, a flexible organic light emitting device may be applied to an automotive lighting device or an automotive display in accordance with a structure or a shape of the vehicle.

A buffer layer 131 may be formed on the substrate 110 to block penetration of impurity elements from the substrate 110 and the outside and protect various elements of the organic light emitting display device 100. The buffer layer 131 may be formed of a structure of a single layer or a plurality of layers of a silicon oxide film (SiOx) or a silicon nitride film (SiNx). The buffer layer 131 may be omitted depending on a structure or a characteristic of the organic light emitting display device 100.

A thin film transistor 120 which includes a semiconductor layer 122, a gate insulating layer 132, a gate electrode 121, an interlayer insulating layer 133, a source electrode 123, and a drain electrode 124 is formed on the buffer layer 131.

Specifically, the semiconductor layer 122 is formed on the substrate 110 and the gate insulating layer 132 which insulates the semiconductor layer 122 from the gate electrode 121 is formed on the semiconductor layer 122. The interlayer insulating layer 133 which insulates the gate electrode 121 from the source electrode 123 and the drain electrode 124 is formed on the gate electrode 121. The source electrode 123 and the drain electrode 124 which are in contact with the semiconductor layer 122 respectively are formed on the interlayer insulating layer 133. The source electrode 123 or the drain electrode 124 is electrically connected to the semiconductor layer 122 through a contact hole.

The semiconductor layer 122 may be formed of amorphous silicon (a-Si), polycrystalline silicon (poly-Si), an oxide semiconductor, an organic semiconductor, or the like. When the semiconductor layer 122 is formed of an oxide semiconductor, the semiconductor layer 122 may be formed of any one of indium gallium zinc oxide (IGZO), zinc tin oxide (ZTO), indium zinc oxide (IZO), indium gallium oxide (IGO), and indium tin zinc oxide (ITZO), but is not limited thereto.

The gate insulating layer 132 may be formed of a structure of a single layer or a plurality of layers which is formed of an inorganic insulating material, such as a silicon oxide film (SiOx) or a silicon nitride film (SiNx).

The gate electrode 121 performs a function of transmitting a gate signal to the thin film transistor 120. The gate electrode may be formed of at least one of metals such as aluminum (Al), molybdenum (Mo), titanium (Ti), and copper (Cu) or an alloy thereof and may be formed of a structure of a single layer or a plurality of layers of the above-mentioned metal or material, but is not limited thereto.

The source electrode 123 and the drain electrode 124 enable an electric signal transmitted from the outside from the thin film transistor 120 to the light emitting unit 150. The source electrode 123 and the drain electrode 124 may be formed of at least one of metals such as aluminum (Al), molybdenum (Mo), titanium (Ti), and copper (Cu) or an alloy thereof and may be formed of a structure of a single layer or a plurality of layers of the above-mentioned metal or material, but are not limited thereto.

In this specification, for the convenience of description, among various thin film transistors which may be included in the organic light emitting display device 100, a driving thin film transistor 120 which is connected to the first electrode 140 is illustrated. Each sub pixel may further include a switching thin film transistor or a capacitor.

A protective layer 170 is formed on the thin film transistor 120. The protective layer 170 may be formed of an in organic insulating material. For example, the protective layer 170 may be formed of a silicon oxide film (SiOx), a silicon nitride layer (SiNx), or the like, but is not limited thereto.

Referring to FIG. 1, an auxiliary electrode 135 is formed on the protective layer 170. The auxiliary electrode 135 may be formed between the protective layer 170 and a planarizing layer 134.

In the organic light emitting display device 100 according to the exemplary embodiment of the present disclosure, the auxiliary electrode 135 is disposed below the light emitting unit 150, the first electrode 140, and a bank 145. The auxiliary electrode 135 may be in direct contact with at least one of a plurality of organic layers having a common layer structure included in the light emitting unit 150 through a second contact hole 146 which penetrates the bank 145 and the planarizing layer 134 to be connected to the at least one of the plurality of organic layers. That is, the auxiliary electrode 135 and the organic layer having a common layer structure may be configured to be electrically connected to each other. The plurality of organic layers having a common layer structure may include at least one of hole injecting layer 151 and hole transporting layer 152.

Further, in the organic light emitting display device 100 according to the exemplary embodiment of the present disclosure, a potential difference between the auxiliary electrode 135 and the hole injecting layer 151 of the light emitting unit 150 may be higher than a potential difference between the hole injecting layer 151 of the light emitting unit 150 and the second electrode 160.

As described above, the voltage is applied to the auxiliary electrode 135 such that the potential difference between the auxiliary electrode 135 and the hole injecting layer 151 is higher than the potential difference between the hole injecting layer 151 of the light emitting unit 150 and the second electrode 160. A lateral leakage current may flow through the auxiliary electrode 135 having a higher potential difference as compared with the second electrode 160 of the adjacent sub pixel so that the lateral leakage current flowing to the adjacent sub pixel may be reduced.

The auxiliary electrode 135 may be formed of at least one of aluminum (Al), silver (Ag), calcium (Ca), magnesium (Mg), platinum (Pt), gold (Au), copper (Cu), and indium tin oxide (ITO), but is not limited thereto.

Further, the auxiliary electrode 135 may be disposed to overlap with the first electrode 140 and the bank 145, and disposed below the first electrode 140 and the bank 145.

Further, the auxiliary electrode 135 may be formed to overlap with the source electrode 123 or the drain electrode 124 of the thin film transistor 120 to form a storage capacitance. That is, an additional storage capacitance may be used between (i) the source electrode 123 or the drain electrode 124 and (ii) the auxiliary electrode 135, thereby improving luminance.

The planarizing layer 134 is formed on the auxiliary electrode 135. The planarizing layer 134 performs a function of planarizing components such as the thin film transistor 120 on the substrate 110. The planarizing layer 134 may be configured by a single layer or a plurality of layers and may be formed of an organic material. For example, the planarizing layer 134 may be formed of polyimide or photoacryl, but is not limited thereto. The protective layer 170 and the planarizing layer 134 include a first contact hole 136 which electrically connects the thin film transistor 120 and the first electrode 140 in each sub pixel.

The first electrode 140 is formed on the planarizing layer 134. The first electrode 140 may be an anode and is formed of a conductive material having a high work function to supply holes to the organic light emitting layer 153. The first electrode 140 is electrically connected to the thin film transistor 120 through the first contact hole 136 penetrating the protective layer 170 and the planarizing layer 134. For example, the first electrode 140 may be electrically connected to the source electrode 123 of the thin film transistor 120. Further, the first electrodes 140 of different subpixels are spaced apart from each other. The first electrode 140 may be formed of a transparent conductive material, for example, indium tin oxide (ITO) or indium zinc oxide (IZO), but is not limited thereto.

Further, when the organic light emitting display device 100 according to the exemplary embodiment of the present disclosure is a top emission type, a reflective layer which is formed of a metal material having good reflection efficiency may be formed. For example, the reflective layer formed of a material such as aluminum (Al) or silver (Ag) may be further formed above or below the first electrode 140, so that light emitted from the organic light emitting layer 153 may be reflected by the reflective layer and pass through the second electrode 160.

For example, the first electrode 140 may have a double layered structure in which a transparent conductive layer formed of a transparent conductive material and the reflective layer are sequentially laminated or a triple layered structure in which the transparent conductive layer, the reflective layer, and the transparent conductive layer are sequentially laminated. The reflective layer may be silver (Ag) or an alloy including silver, for example, silver (Ag) or APC (Ag/Pd/Cu).

In the description of the exemplary embodiment of the present disclosure, according to the top emission type, light emitted from the organic light emitting layer 153 is emitted toward the second electrode 160, and according to a bottom emission type, the light is emitted toward the first electrode 140 which is opposite to the top emission type.

The bank 145 is formed on the first electrode 140. The bank 145 defines the sub pixel area. Further, the bank 145 may defines the pixel area configured of a plurality of sub pixel areas. In this case, the bank 145 is in contact with the light emitting unit 150, and more particularly, is in direct contact with the hole injecting layer 151. The bank 145 may be formed of an organic material. For example, the bank 145 may be formed of polyimide, acryl, or benzocyclobutene (BCB) based resin, but is not limited thereto.

Referring to FIG. 1, in the case of the organic light emitting display device 100 according to the exemplary embodiment of the present disclosure, the second contact hole 146 penetrates the bank 145 and the planarizing layer 134. The auxiliary electrode 135 and at least one of a plurality of organic layers having a common layer structure included in the light emitting unit 150 are in direct contact with each other through the second contact hole 146.

The second electrode 160 is formed on the first electrode 140. The second electrode 160 may be a cathode. Since the second electrode 160 supplies electrons to the organic light emitting layer 153, the second electrode is formed of a conductive material having a low work function. More specifically, the second electrode 160 may be a metal material such as magnesium (Mg) or silver-magnesium (Ag:Mg), but is not limited thereto.

Further, when the organic light emitting display device 100 according to the exemplary embodiment of the present disclosure is a top emission type, the second electrode 160 may be formed of indium tin oxide (ITO), indium zin oxide (IZO), indium tin zinc oxide (ITZO), zinc oxide (ZnO), and tin oxide (TiO) based transparent conductive oxide, but is not limited thereto.

The light emitting unit 150 is formed on the first electrode 140 and the bank 145. The light emitting unit 150 may be an organic light emitting diode. If necessary, the light emitting unit 150 includes various organic layers and also includes the organic light emitting layer 153. The organic layers may include at least one of the hole injecting layer 151, the hole transporting layer 152, and the electron transporting layer 154.

The plurality of organic layers included in the light emitting unit 150 have a common layer structure so as to correspond to a red sub pixel R, a green sub pixel G, and a blue sub pixel B. At least one of the plurality of organic layers may be in direct contact with and electrically connected to the auxiliary electrode 135 through the second contact hole 146.

More specifically, the plurality of organic layers may include a p type hole transporting layer obtained by doping a p type dopant on the hole injecting layer 151 or the hole transporting layer 152 which serves to smoothly inject the holes into the organic light emitting layer 153. The hole injecting layer 151 or the hole transporting layer 152 may be formed with a common layer structure to be commonly disposed on the plurality of sub pixels.

In the case of the organic light emitting display device of the related art, as the resolution is increased, an area allocated for an electrode or a wiring line is reduced, so that it is difficult to prevent the lateral leakage current from adjacent subpixels. However, in the case of the organic light emitting display device 100 according to the exemplary embodiment of the present disclosure, the auxiliary electrode 135 is formed between the protective layer 170 and the planarizing layer 134 below the light emitting unit 150. Further, the organic layer with a common layer structure of the light emitting unit 150 and the auxiliary electrode 135 are connected through the second contact hole 146 formed through the bank 145 and the planarizing layer 134 to sink the lateral leakage current. Therefore, it is possible to prevent an unintended adjacent sub pixel from emitting light due to the lateral leakage current despite the increased resolution of the organic light emitting display device. Further, it is possible to prevent an unintended mixture of color from adjacent sub pixels, thereby improving a display quality of the organic light emitting display device. Furthermore, it is possible to improve reliability of the organic light emitting display device.

Figure 2:
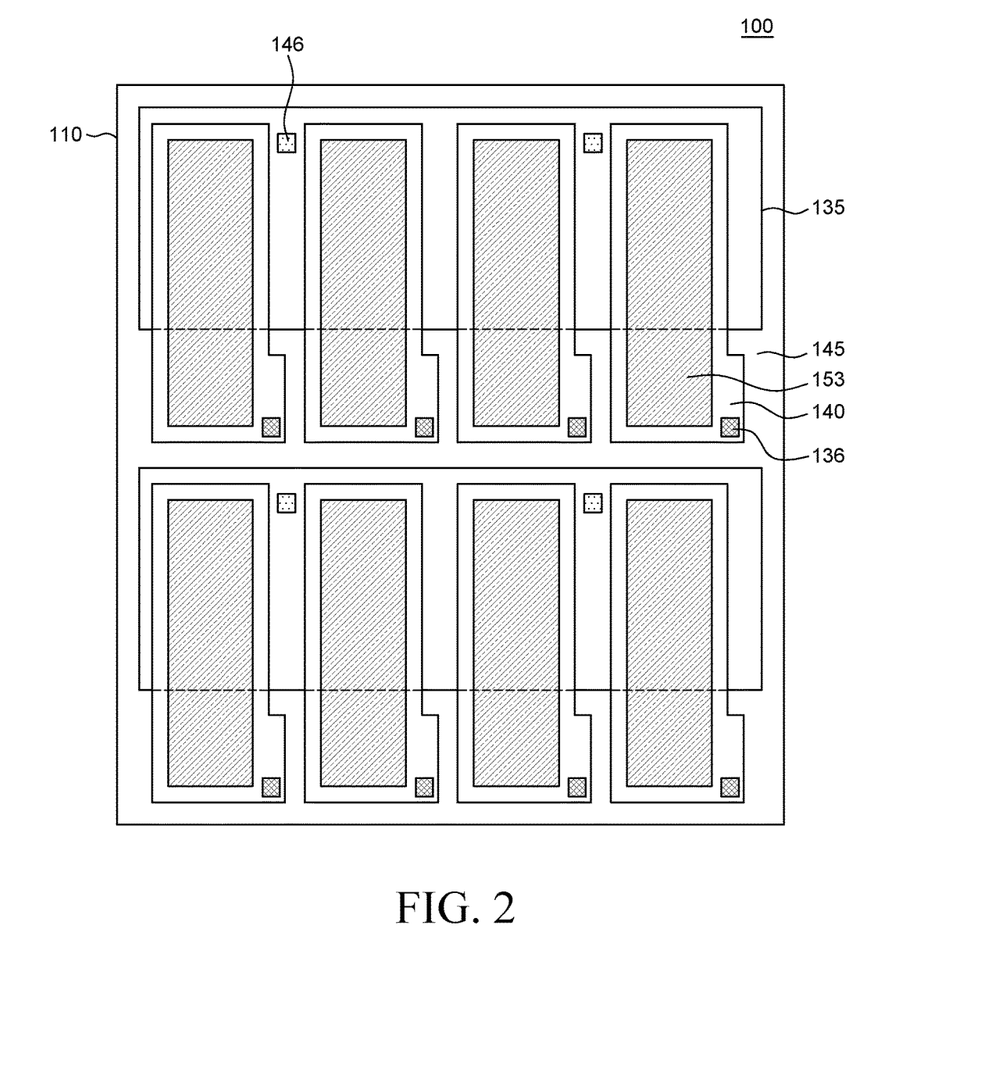
FIG. 2 is a view illustrating a planar structure of an organic light emitting display device according to an exemplary embodiment of the present disclosure.

FIG. 2 is a view illustrating a planar structure of an organic light emitting display device according to an exemplary embodiment of the present disclosure. Components described in this specification are not limited to the arrangement of the components illustrated in FIG. 2, but may be formed in various manners.

Referring to FIG. 2, the organic light emitting display device 100 according to the exemplary embodiment of the present disclosure includes an area where the first electrode 140 is formed, an emission area where the organic light emitting layer 153 is formed, and an area where the bank 145 is formed.

First, a first contact hole 136 through which the first electrode 140 and the thin film transistor are connected is formed on the substrate 110.

Further, the bank 145 is formed to overlap with one side of the first electrode 140 and encloses the first electrode 140. The bank 145 defines an emission area of the organic light emitting display device, and subpixels. The emission area where the organic light emitting layer 153 is formed is formed in an area which is smaller than the area where the first electrode 140 is formed. That is, the organic light emitting layer 153 is formed on a portion of the first electrode 140 exposed by the bank 145.

Further, a plurality of organic layers having a common layer structure which corresponds to the plurality of sub pixels are formed below the organic light emitting layer 153 included in the light emitting unit 150.

Further, in the organic light emitting display device 100 according to the exemplary embodiment of the present disclosure, the auxiliary electrode 135 may be disposed below the light emitting unit 150, the first electrode 140, and the bank 145 and may be formed to cover an entire surface of the display panel except the first contact hole 136 and/or other contact holes.

The auxiliary electrode 135 may be in direct contact with at least one of the plurality of organic layers having a common layer structure included in the light emitting unit 150 through the second contact hole 146 which penetrates the bank 145 and the planarizing layer 134. That is, the auxiliary electrode 135 and the organic layer having a common layer structure may be configured to be electrically connected to each other. The plurality of organic layers having a common layer structure may include at least one hole injecting layer 151 or hole transporting layer 152.

That is, in the case of the organic light emitting display device 100 according to the exemplary embodiment of the present disclosure, the auxiliary electrode 135 is formed below the light emitting unit 150 to directly connect the organic layer with a common layer structure through the second contact hole 146. Therefore, the lateral leakage current flows to the auxiliary electrode 135 to prevent an unintended adjacent sub pixel from emitting light. Further, the auxiliary electrode 135 is configured to overlap with a source electrode or a drain electrode of the thin film transistor, thereby providing an additional storage capacitance.

Figure 3:
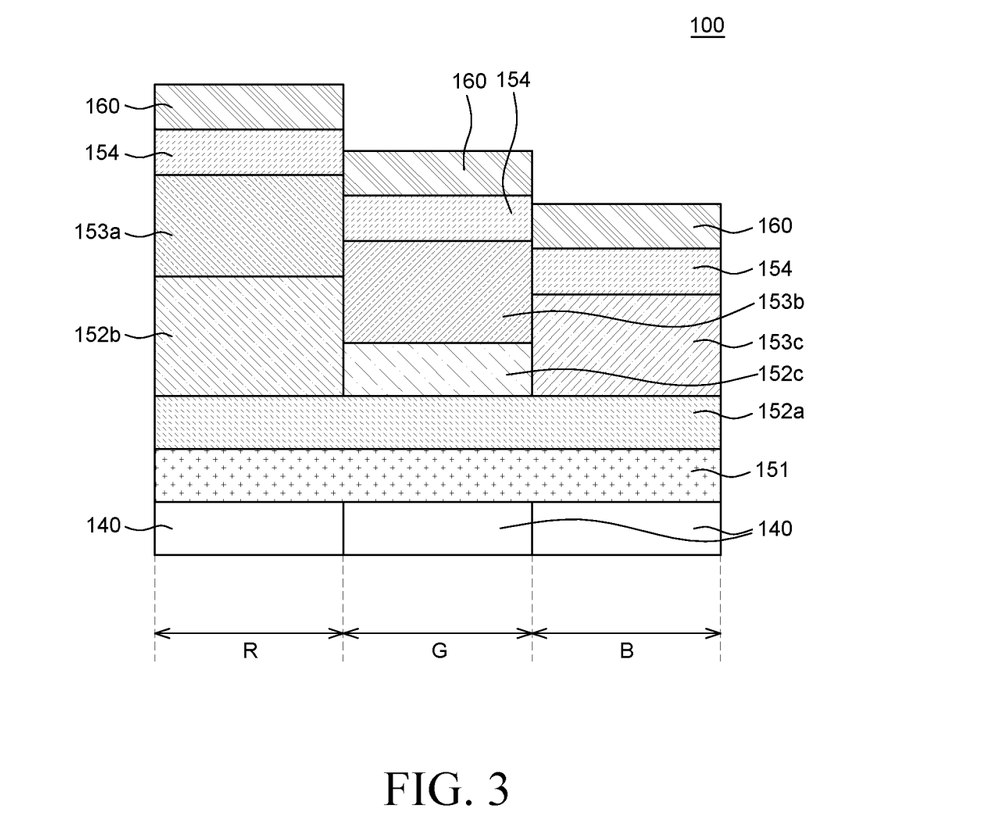
FIG. 3 is an enlarged view illustrating a cross-sectional structure of an organic light emitting element of an organic light emitting display device according to an exemplary embodiment of the present disclosure.

FIG. 3 is an enlarged view illustrating a cross-sectional structure of an organic light emitting element of an organic light emitting display device according to an exemplary embodiment of the present disclosure.

Hereinafter, the light emitting unit 150 (e.g., organic light emitting diode) of the organic light emitting display device 100 according to the exemplary embodiment of the present disclosure will be described in more detail with reference to FIG. 3.

Referring to FIG. 3, the light emitting unit 150 of the organic light emitting display device 100 according to the exemplary embodiment of the present disclosure includes a hole injecting layer (HIL) 151 disposed on the first electrode 140, a first hole transporting layer (1st HTL) 152a disposed on the hole injecting layer 151, a second hole transporting layer (2nd HTL) 152b disposed on the first hole transporting layer 152a, and a third hole transporting layer (3rd HTL) 152c, an organic light emitting layer (EML) including a red light emitting layer 153a, a green light emitting layer 153b, and a blue light emitting layer 153c disposed on the hole transporting layers 152a, 152b, and 152c, and an electron transporting layer (ETL) 154 disposed on the organic light emitting layer.

The first electrode 140 is disposed on the planarizing layer 134 so as to correspond to the red sub pixel area R, the green sub pixel area G, and the blue sub pixel area B, respectively, defined on the substrate.

The hole injecting layer 151 is disposed on the first electrode 140 as a common layer so as to correspond to the red sub pixel area R, the green sub pixel area G, and the blue sub pixel area B.

The hole injecting layer 151 may serve to smoothly inject the holes and be formed of at least one of 1,4,5,8,9,11-hexaazatriphenylene-hexanitrile (HATCN), cupper phthalocyanine (CuPc), poly(3,4)-ethylenedioxythiophene (PEDOT), polyaniline (PANI), N,N-dinaphthyl-N,N'-diphenylbenzidine (NPD), N,N'-Bis(3-methylphenyl)-N,N"-bis(phenyl)-benzidine (TPD), Bis[N-(1-naphthyl)-N-phenyl]benzidine (α-NPB), 1,3,5-tris(4-diphenylaminophenyl)benzene (TDAPB), Tris(4-carbazoyl-9-yl)triphenylamine (TCTA), 2,2',7,7"-Tetrakis(N,N-diphenylamino)-9,9-spirobifluorene (spiro-TAD), and 4,4'-bis(carbazol-9-yl)biphenyl (CBP), but is not limited thereto.

The hole injecting layer 151 may be formed by doping a p type dopant into a material which forms the first hole transporting layer 152a. In this case, the hole injecting layer 151 and the second hole transporting layer 152b may be formed by a continuous process using one processing equipment. The p type dopant may be formed of 2,3,5,6-tetrafluoro-7,7,8,8-tetracyano-quinidimethane (F4-TCNQ), but is not limited thereto.

The first hole transporting layer 152a is disposed on the hole injecting layer 151 as a common layer so as to correspond to the red sub pixel area R, the green sub pixel area G, and the blue sub pixel area B. The first hole transporting layer 152a serves to smoothly transport the holes. The first hole transporting layer 152a may be formed of at least one or more of N,N-dinaphthyl-N,N'-diphenylbenzidine (NPD), N,N'-bis-(3-methylphenyl)-N,N'-bis-(phenyl)-benzidine (TPD), 2,2',7,7"-Tetrakis(N,N-diphenylamino)-9,9-spirobifluorene (spiro-TAD), and 4,4',4"-Tris(N-3-methylphenyl-N-phenyl-amino)-triphenylamine (MTDATA), but is not limited thereto.

The second hole transporting layer 152b is disposed on the first hole transporting layer 152a of the red sub pixel area R. The third hole transporting layer 152c is disposed on the first hole transporting layer 152a of the green sub pixel area G.

The second hole transporting layer 152b and the third hole transporting layer 152c serve to smoothly transmit holes from the hole injecting layer 151 to the red light emitting layer 153a and the green light emitting layer 153b, respectively.

Further, each of the second hole transporting layer 152b and the third hole transporting layer 152c has a corresponding thickness to form a micro cavity. More specifically, thicknesses of the second hole transporting layer 152b and the third hole transporting layer 152c may be determined such that the red light emitting layer 153a forms a micro cavity structure between the first electrode 140 and the second electrode 160 and the green light emitting layer 153b forms a micro cavity structure between the first electrode 140 and the second electrode 160. Further, the optical distance of the micro cavity is formed in the red sub pixel area R and the green sub pixel area G, to improve the efficiency of the organic light emitting display device 100.

The red light emitting layer 153a is disposed on the second hole transporting layer 152b of the red sub pixel area R. The red light emitting layer 153a may include a light emitting material that emits red light and the light emitting material may be formed using a phosphorescent or a fluorescent material.

More specifically, the red light emitting layer 153a may include a host material including carbazole biphenyl (CBP) or 1,3-bis(carbazol-9-yl)benzene (mCP), and may be formed of a phosphorescent material including a dopant including any one or more of bis(2-benzo[b]thiophen-2-yl-pyridine) (acetylacetonate)iridium(III) (Ir(btp)2(acac)), bis(1-phenylisoquinoline)(acetylacetonate)iridium(III) (Ir(piq)2 (acac)), tris(1-phenylquinoline)iridium(III) (Ir(piq)3), and octaethylporphyrin platinum (PtOEP). Otherwise, the red light emitting layer 153a may be formed of a fluorescent material including PBD:Eu(DBM)3(Phen) or perylene, but is not limited thereto.

The green light emitting layer 153b is disposed on the third hole transporting layer 152c of the green sub pixel area G. The green light emitting layer 153b may include a light emitting material that emits green light and the light emitting material may be formed using a phosphorescent or a fluorescent material.

More specifically, the green light emitting layer 153b may include a host material including CBP or mCP and may be formed of a phosphorescent material including a dopant material such as iridium complex including Ir(ppy)3(tris(2-phenylpyridine)iridium(III)) or Ir(ppy)2(acaa)(bis(2-phenylpyridine)(acetylacetonate)iridium(III). Otherwise, the green light emitting layer 153b may include a fluorescent material including Alq3(tris(8-hydroxyquinolino)aluminum), but is not limited thereto.

The blue light emitting layer 153c is disposed on the first hole transporting layer 152a of the blue sub pixel area B. The blue light emitting layer 153c may include a light emitting material that emits blue light and the light emitting material may be formed using a phosphorescent or a fluorescent material.

More specifically, the blue light emitting layer 153c may include a host material including CBP or mCP and may be formed of a phosphorescent material including a dopant material including FIrPic(bis(3,5,-difluoro-2-(2-pyridyl) phenyl-(2-carboxypyridyl)iridium(III)). Further, the blue light emitting layer 153c may be formed of a fluorescent material including any one of DPVBi(4,4'-bis[4-di-p-tolylamino)stryl)biphenyl), DSA(1-4-di-[4-(N,N-di-phenyl) amino]styryl-benzene), PFO (polyfluorene) based polymers, and PPV (polyphenylenevinylene) based polymers, but is not limited thereto.

The electron transporting layer 154 is disposed on the red light emitting layer 153a, the green light emitting layer 153b, and the blue light emitting layer 153c so as to correspond to the red sub pixel area R, the green sub pixel area G, and the blue sub pixel area B.

The electron transporting layer 154 serves to transport and inject the electrons and the thickness of the electron transporting layer 154 may be adjusted in consideration of an electron transporting characteristic.

The electron transporting layer 154 serves to smoothly transport the electrons. The electron transporting layer 154 may be formed on any one or more of Liq(8-hydroxyquinolinolato-lithium), Alq3(tris(8-hydroxyquinolinato)aluminum), PBD(2-(4-biphenylyl)-5-(4-tert-butylpheny)-1,3,4oxadiazole), TAZ(3-(4-biphenyl)4-phenyl-5-tert-butylphenyl-1,2,4-triazole), spiro-PBD and BAlq(bis(2-methyl-8-quinolinolate)-4-(phenylphenolato)aluminium), but is not limited thereto.

Further, the electron injecting layer (EIL) may be further provided on the electron transporting layer 154.

The electron injecting layer EIL may be formed of a metal inorganic compound such as $BaF_2$, LiF, NaCl, CsF, $Li_2O$, and BaO, but is not limited thereto.

Here, the structure is not restricted according to the exemplary embodiment of the present disclosure and at least one of the hole injecting layer 151, the first hole transporting layer 152a, the second hole transporting layer 152b and the electron transporting layer 154 may be omitted. Further, any one of the hole injecting layer 151, the first hole transporting layer 152a, the second hole transporting layer 152b and the electron transporting layer 154 may be formed of two or more layers.

The second electrode 160 is disposed on the electron transporting layer 154 so as to correspond to the red sub pixel area R, the green sub pixel area G, and the blue sub pixel area B.

A capping layer may be disposed on the second electrode 160. The capping layer is provided to improve a light extracting effect of the organic light emitting display device and may be formed of any one of host materials of the first hole transporting layer 152a, the electron transporting layer 154, the red light emitting layer 153a, the green light emitting layer 153b, and the blue light emitting layer 153c. Further, the capping layer may be omitted in accordance with the structure or the characteristic of the organic light emitting display device 100.

The organic light emitting layer 153 of the organic light emitting display device 100 according to the exemplary embodiment of the present disclosure may be configured to include at least one phosphorescent material. More specifically, the organic light emitting layer 153 may be configured to include the red light emitting layer 153a which is disposed in the red sub pixel R to emit red light, the green light emitting layer 153b which is disposed in the green sub pixel G to emit green light, and the blue light emitting layer 153c which is disposed in the blue sub pixel B to emit blue light. Here, the red light emitting layer 153a includes phosphorescent material and the green light emitting layer 153b and the blue light emitting layer 153c include a fluorescent material. Alternatively, the red light emitting layer 153a and the green light emitting layer 153b include phosphorescent material, and the blue light emitting layer 153c includes a fluorescent material. Alternatively, the red light emitting layer 153a, the green light emitting layer 153b, and the blue light emitting layer 153c include a phosphorescent material.

Further, the organic light emitting display device 100 according to the exemplary embodiments of the present disclosure may be applied to display devices including a TV, a mobile phone, a tablet PC, a monitor, a laptop computer, an automotive display device, and an automotive lighting device. Alternatively, the organic light emitting display device 100 according to the exemplary embodiments of the present disclosure may also be applied to a wearable display device, a foldable display device, a rollable display device, and the like.

Figure 4:
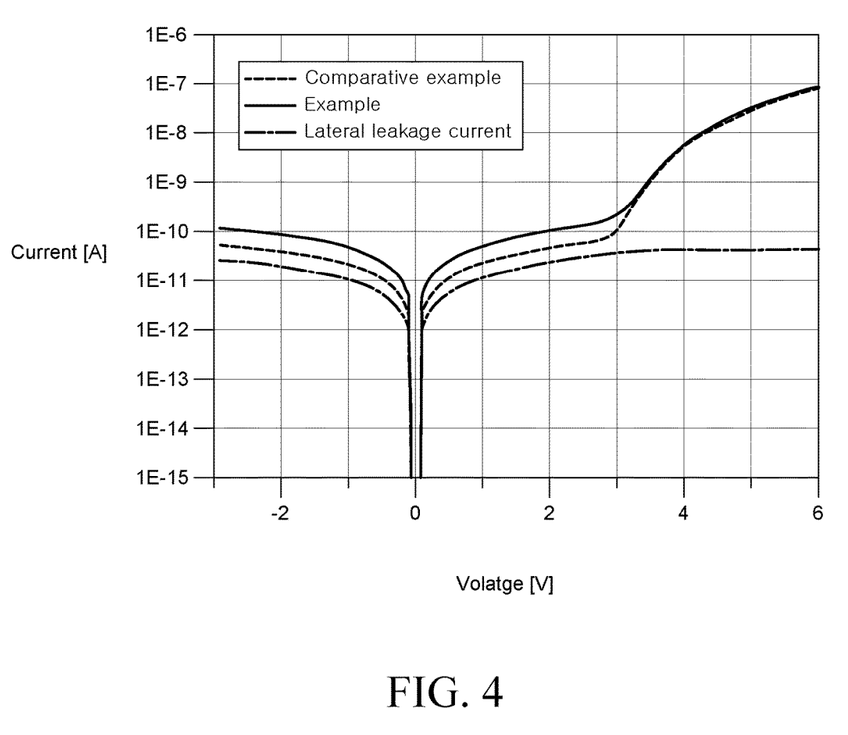
FIG. 4 is a view illustrating voltage-current experiment results of an organic light emitting display device according to a comparative example and an organic light emitting display device according to an example embodiment of the present disclosure.

FIG. 4 is a view illustrating a voltage-current experiment result of an organic light emitting display device according to "a comparative example" and "an example" of the present disclosure.

Referring to FIG. 4, "a comparative example" represents a voltage-current experiment result of a blue organic light emitting display device of the related art which does not include an auxiliary electrode. Further, "the example" represents a voltage-current experiment result of a blue organic light emitting display device according to the exemplary embodiment of the present disclosure which includes an auxiliary electrode in direct contact with an organic layer having a common layer structure included in a light emitting unit.

Referring to FIG. 4, according to "the comparative example," as compared with "the example," the current is low at a low voltage, that is, a low gray level. Therefore, as also illustrated in FIG. 4, the current level is low as much as the lateral leakage current is generated due to the influence of the generated lateral leakage current, as compared with "the example."

In the case of the blue organic light emitting display device according to the exemplary embodiment of the present disclosure including the auxiliary electrode, which is in direct contact with the organic layer with a common layer structure included in the light emitting unit to be connected, the current level is increased as much as the lateral leakage current, as compared with "the comparative example." Further, the lateral leakage current flows to the auxiliary electrode by implementing the auxiliary electrode directly connected to the organic layer with a common layer structure below the light emitting unit. Thus, lateral leakage current flowing to the adjacent sub pixel can be reduced.

Figure 5A:
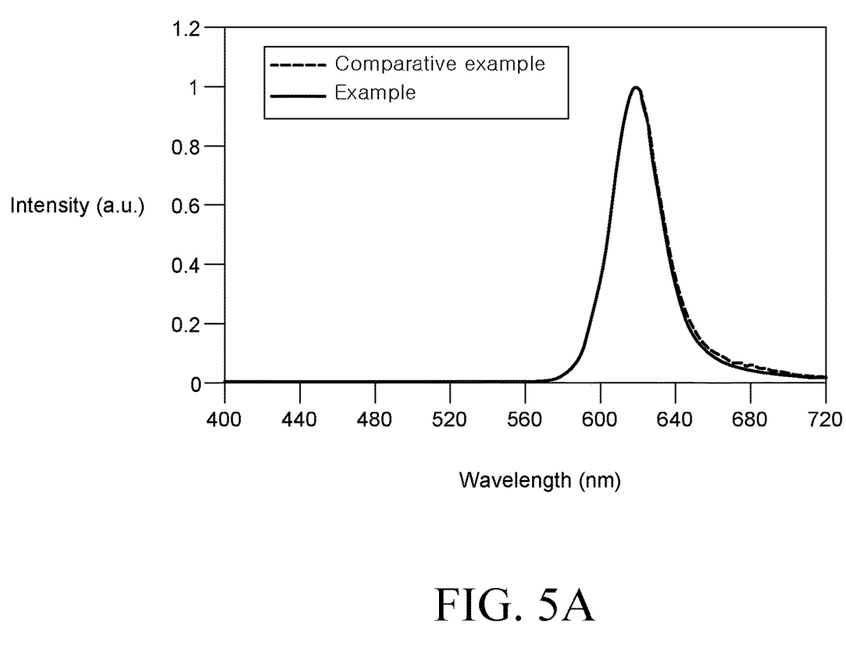
FIGS. 5A to 5C are views illustrating EL spectrum evaluation results of an organic light emitting display device according to a comparative example and an organic light emitting display device according to an example embodiment of the present disclosure.
Figure 5B:
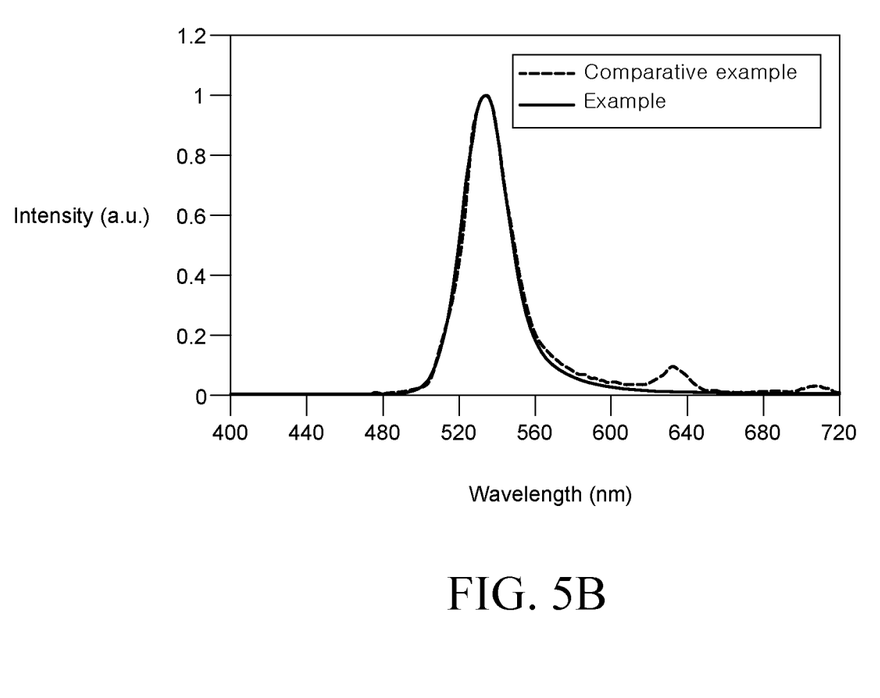
Figure 5C:
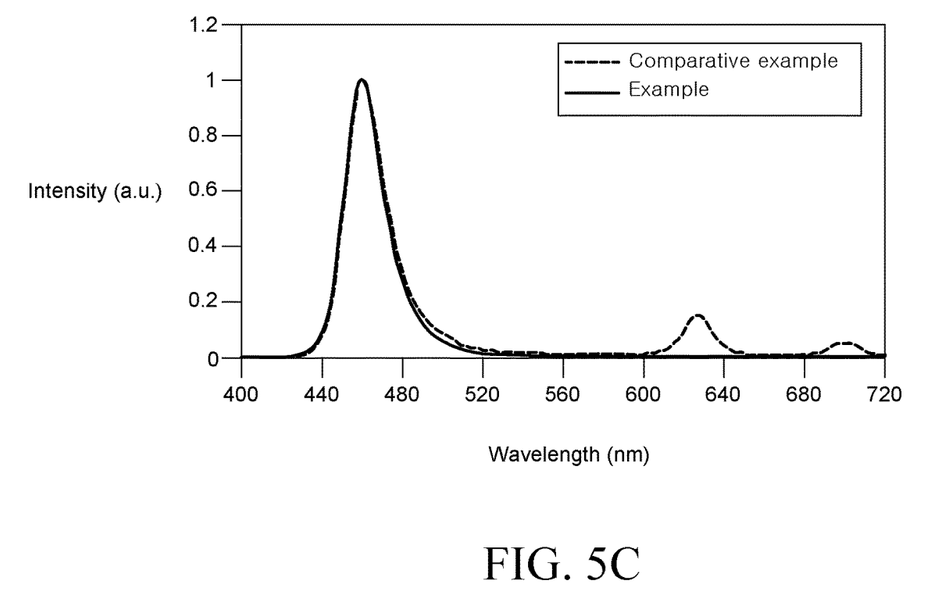

FIGS. 5A to 5C are views illustrating an EL spectrum evaluation results of an organic light emitting display device according to "a comparative example" and an organic light emitting display device according to "an example" of the present disclosure.

"The comparative example" represents an EL spectrum evaluation result in the organic light emitting display device which does not include the auxiliary electrode. "The example" represents an EL spectrum evaluation result in the organic light emitting display device according to the exemplary embodiment of the present disclosure which includes an auxiliary electrode directly in contact with the organic layer with a common layer structure included in the disclosed light emitting unit.

Referring to FIGS. 5A to 5C, FIG. 5A is a view illustrating an EL spectrum evaluation result of a red organic light emitting display device according to "the comparative example" and "the example" of the present disclosure. FIG. 5B is a view illustrating an EL spectrum evaluation result of a green organic light emitting display device according to "the comparative example" and "the example" of the present disclosure. Further, FIG. 5C is a view illustrating an EL spectrum evaluation result of a blue organic light emitting display device according to "the comparative example" and "the example" of the present disclosure.

Referring to FIG. 5A, from the EL spectrums of "the comparative example" and "the example," when red light is emitted in both "the comparative example" and "the example," only a red peak is represented. Therefore, adjacent sub pixels do not emit light.

Referring to FIG. 5B, it is confirmed that when the green light is emitted, a green peak and a red peak are simultaneously output in "the comparative example." In contrast to "the comparative example," when the green light is emitted, the red peak is not output in "the example." That is, as compared with "the comparative example," emission of light with a different color output from an adjacent pixel due to the lateral leakage current can be prevented, in "the example."

Further, referring to FIG. 5C, it is confirmed that when the blue light is emitted, a blue peak and a red peak are simultaneously represented in "the comparative example." However, differently from "the comparative example," it is confirmed that when the blue light is emitted, the red peak is not represented in "the example." That is, as compared with "the comparative example," light with different color output by the adjacent pixel due to the lateral leakage current is reduced in "the example."

From the above-described result, the organic light emitting display device according to the exemplary embodiment of the present disclosure electrically connects the auxiliary electrode below the light emitting unit and the organic layer having a common layer structure to allow lateral leakage current to flow through the auxiliary electrode, thereby preventing an unintended sub pixel from emitting light due to the lateral leakage current.

The organic light emitting display device according to the exemplary embodiment of the present disclosure prevents an unintended sub pixel from emitting light due to a lateral leakage current, and prevents color mixture of light output from adjacent sub pixels, thereby improving a display quality of the organic light emitting display device.

Moreover, the organic light emitting display device according to the exemplary embodiment of the present disclosure improves the reliability of the organic light emitting display device.

The exemplary embodiments of the present disclosure can also be described as follows:

Embodiments disclosed herein relate to an electroluminescent display device comprising a thin film transistor on a surface of a substrate facing in a first direction, a protective layer on the thin film transistor, a planarizing layer covering a surface of the protective layer facing in the first direction, a first electrode disposed on a surface of the planarizing layer facing in the first direction and connected to the thin film transistor, a bank on one side of the first electrode, a light emitting unit disposed on a surface of the first electrode, the light emitting unit including a transporting layer and a light emitting layer, a second electrode on a surface of the light emitting unit facing in the first direction, and an auxiliary electrode disposed below the first electrode and the bank, a first area of the auxiliary electrode facing a portion of the bank in the first direction, the auxiliary electrode directly connected to the transporting layer.

In one or more embodiments, the auxiliary electrode is disposed between the protective layer and the planarizing layer. The transporting layer and the auxiliary electrode may be connected to each other through a contact hole penetrating the planarizing layer and the bank.

In one or more embodiments, the transporting layer includes at least one of a hole injecting layer and a hole transporting layer.

In one or more embodiments, the auxiliary electrode is electrically connected to the first electrode.

In one or more embodiments, a second area of the auxiliary electrode faces a portion of the first electrode in the first direction.

In one or more embodiments, the electroluminescent display device further includes a red light emitting layer of a red sub pixel, a green light emitting layer of a green sub pixel, and a blue light emitting layer of a blue sub pixel. The red light emitting layer, the green light emitting layer, and the blue light emitting layer may include at least one phosphorescent material.

In one or more embodiments, the auxiliary electrode is formed of at least one of aluminum (Al), silver (Ag), calcium (Ca), magnesium (Mg), platinum (Pt), gold (Au), copper (Cu), and indium tin oxide (ITO).

Embodiments disclosed herein relate to an organic light emitting display device including an organic layer corresponding to a red sub pixel, a green sub pixel, and a blue sub pixel, and organic light emitting layers, each corresponding to a respective one of the red sub pixel, the green sub pixel, and the blue sub pixel. The organic layer and the organic light emitting layers may be disposed between a first electrode and a second electrode. The organic layer may be in contact with an auxiliary electrode below the first electrode through a contact hole penetrating a bank which defines at least one of the red sub pixel, the green sub pixel, and the blue sub pixel.

In one or more embodiments, the organic light emitting display device further includes a thin film transistor, a protective layer, and a planarizing layer configured below the first electrode. The auxiliary electrode may be disposed between the protective layer and the first electrode.

In one or more embodiments, the organic layer includes at least one of a hole injecting layer and a hole transporting layer.

In one or more embodiments, the thin film transistor includes a gate electrode, a source electrode, and a drain electrode. The auxiliary electrode may form a storage capacitance together with the source electrode or the drain electrode.

In one or more embodiments, a first area of the auxiliary electrode overlaps with a portion of the first electrode and a second area of the auxiliary electrode overlaps with a portion of the bank.

Embodiments disclosed herein relate to a light emitting display device comprising a plurality of subpixels, the plurality of subpixels including at least a first subpixel and a second subpixel. The light emitting display device includes a common layer shared by a first light emitting diode of the first subpixel and a second light emitting diode of the second subpixel, the common layer disposed between a first anode electrode and a first cathode electrode of the first subpixel and between a second anode electrode and a second cathode electrode of the second subpixel, and an auxiliary electrode disposed on a different layer from the common layer, the first anode electrode, the first cathode electrode, the second anode electrode, and the second cathode electrode, the auxiliary electrode connected to the common layer through a contact hole.

In one or more embodiments, a first area of the auxiliary electrode overlaps with a portion of the first light emitting diode and a second area of the auxiliary electrode overlaps with a portion of the second light emitting diode. The first area of the auxiliary electrode may overlap with a portion of the first anode electrode and the second area of the auxiliary electrode may overlap with a portion of the second anode electrode.

In one or more embodiments, the contact hole penetrates a bank separating the first light emitting diode and the second light emitting diode.

In one or more embodiments, the light emitting display device further includes a thin film transistor to control an operation of one of the first light emitting diode and the second light emitting diode, and a protective layer covering the thin film transistor, the protective layer formed between the thin film transistor and the one of the first light emitting diode and the second light emitting diode. The auxiliary electrode may be disposed between the protective layer and the one of the first light emitting diode and the second light emitting diode.

In one or more embodiments, the common layer includes at least one of a hole injecting layer and a hole transporting layer.

In one or more embodiments, the common layer includes an organic material.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
   a thin film transistor on a surface of a substrate facing in a first direction;
   a protective layer on the thin film transistor;
   a planarizing layer covering a surface of the protective layer facing in the first direction;
   a first electrode disposed on a surface of the planarizing layer facing in the first direction and connected to the thin film transistor;
   a bank on one side of the first electrode;
   a light emitting unit disposed on a surface of the first electrode, the light emitting unit including a transporting layer and a light emitting layer;
   a second electrode on a surface of the light emitting unit facing in the first direction; and
   an auxiliary electrode disposed below the first electrode and the bank, a first area of the auxiliary electrode facing a portion of the bank in the first direction, the auxiliary electrode directly connected to the transporting layer,
   wherein a second area of the auxiliary electrode faces a portion of the first electrode in the first direction.

2. The electroluminescent display device according to claim 1, wherein the auxiliary electrode is disposed between the protective layer and the planarizing layer.

3. The electroluminescent display device according to claim 2, wherein the transporting layer and the auxiliary electrode are connected to each other through a contact hole penetrating the planarizing layer and the bank.

4. The electroluminescent display device according to claim 1, wherein the transporting layer includes at least one of a hole injecting layer and a hole transporting layer.

5. The electroluminescent display device according to claim 1, wherein the auxiliary electrode is electrically connected to the first electrode.

6. The electroluminescent display device according to claim 1, further comprising:

a red light emitting layer of a red sub pixel, a green light emitting layer of a green sub pixel, and a blue light emitting layer of a blue sub pixel, wherein the red light emitting layer, the green light emitting layer, and the blue light emitting layer include at least one phosphorescent material.

7. The electroluminescent display device according to claim 1, wherein the auxiliary electrode is formed of at least one of aluminum (Al), silver (Ag), calcium (Ca), magnesium (Mg), platinum (Pt), gold (Au), copper (Cu), and indium tin oxide (ITO).

8. An organic light emitting display device comprising:
an organic layer corresponding to a red sub pixel, a green sub pixel, and a blue sub pixel; and
organic light emitting layers, each corresponding to a respective one of the red sub pixel, the green sub pixel, and the blue sub pixel,
wherein the organic layer and the organic light emitting layers are disposed between a first electrode and a second electrode,
wherein the organic layer is in contact with an auxiliary electrode below the first electrode through a contact hole penetrating a bank which defines at least one of the red sub pixel, the green sub pixel, and the blue sub pixel,
wherein a first area of the auxiliary electrode overlaps with a portion of the first electrode and a second area of the auxiliary electrode overlaps with a portion of the bank.

9. The organic light emitting display device according to claim 8, further comprising:
a thin film transistor, a protective layer, and a planarizing layer configured below the first electrode,
wherein the auxiliary electrode is disposed between the protective layer and the first electrode.

10. The organic light emitting display device according to claim 9, wherein the organic layer includes at least one of a hole injecting layer and a hole transporting layer.

11. The organic light emitting display device according to claim 9, wherein the thin film transistor includes a gate electrode, a source electrode, and a drain electrode, and wherein the auxiliary electrode forms a storage capacitance together with the source electrode or the drain electrode.

12. A light emitting display device comprising a plurality of subpixels, the plurality of subpixels including at least a first subpixel and a second subpixel, the light emitting display device comprising:
a common layer shared by a first light emitting diode of the first subpixel and a second light emitting diode of the second subpixel, the common layer disposed between a first anode electrode and a first cathode electrode of the first subpixel and between a second anode electrode and a second cathode electrode of the second subpixel; and
an auxiliary electrode disposed on a different layer from the common layer, the first anode electrode, the first cathode electrode, the second anode electrode, and the second cathode electrode, the auxiliary electrode connected to the common layer through a contact hole,
wherein a first area of the auxiliary electrode overlaps with a portion of the first light emitting diode and a second area of the auxiliary electrode overlaps with a portion of the second light emitting diode.

13. The light emitting display device of claim 12, wherein the first area of the auxiliary electrode overlaps with a portion of the first anode electrode and the second area of the auxiliary electrode overlaps with a portion of the second anode electrode.

14. The light emitting display device of claim 12, wherein the contact hole penetrates a bank separating the first light emitting diode and the second light emitting diode.

15. The light emitting display device according to claim 12, further comprising:
a thin film transistor to control an operation of one of the first light emitting diode and the second light emitting diode; and
a protective layer covering the thin film transistor, the protective layer formed between the thin film transistor and the one of the first light emitting diode and the second light emitting diode, wherein the auxiliary electrode is disposed between the protective layer and the one of the first light emitting diode and the second light emitting diode.

16. The light emitting display device according to claim 12, wherein the common layer includes at least one of a hole injecting layer and a hole transporting layer.

17. The light emitting display device according to claim 12, wherein the common layer includes an organic material.

* * * * *

UNITED STATES PATENT AND TRADEMARK OFFICE
CERTIFICATE OF CORRECTION

| | | |
|---|---|---|
| PATENT NO. | : 9,997,734 B2 | Page 1 of 1 |
| APPLICATION NO. | : 15/592844 | |
| DATED | : June 12, 2018 | |
| INVENTOR(S) | : Sunkap Kwon and Kyuil Han | |

It is certified that error appears in the above-identified patent and that said Letters Patent is hereby corrected as shown below:

On the Title Page

Under item (73) Assignee "LG Display Co., LTD, Seoul (KR)" should be -- LG Display Co., Ltd., Seoul (KR) --

Signed and Sealed this
Twenty-first Day of August, 2018

Andrei Iancu
*Director of the United States Patent and Trademark Office*